(12) United States Patent
Abel et al.

(10) Patent No.: US 7,656,255 B2
(45) Date of Patent: Feb. 2, 2010

(54) METHODS AND APPARATUS FOR PROGRAMMABLE ACTIVE INDUCTANCE

(75) Inventors: Christopher J. Abel, Coplay, PA (US); Robert J. Kapuschinsky, Hazleton, PA (US); Gary D. Polhemus, Sebago, ME (US)

(73) Assignee: Agere Systems Inc., Allentown, PA (US)

( * ) Notice: Subject to any disclaimer, the term of this patent is extended or adjusted under 35 U.S.C. 154(b) by 128 days.

(21) Appl. No.: 11/680,323

(22) Filed: Feb. 28, 2007

(65) Prior Publication Data

US 2008/0204171 A1    Aug. 28, 2008

(51) Int. Cl.
*H03H 11/02* (2006.01)
(52) U.S. Cl. ........................ 333/214; 333/215
(58) Field of Classification Search ................ 333/214, 333/215; 331/57
See application file for complete search history.

(56) References Cited

U.S. PATENT DOCUMENTS

| | | | |
|---|---|---|---|
| 6,850,106 B1 * | 2/2005 | Kunanayagam et al. | 327/266 |
| 6,949,971 B2 * | 9/2005 | Jang | 327/541 |
| 7,199,685 B2 * | 4/2007 | Gill | 333/214 |
| 2001/0019288 A1 * | 9/2001 | Wada et al. | 327/561 |
| 2006/0044099 A1 | 3/2006 | Gill | |

* cited by examiner

*Primary Examiner*—Daniel D Chang
(74) *Attorney, Agent, or Firm*—Ryan, Mason & Lewis, LLP

(57) ABSTRACT

Methods and apparatus are provided for programmable active inductance. The disclosed active inductor devices provide a tunable bandwidth with improved linearity. The disclosed active inductors have a variable frequency response corresponding to a variable inductance of the active inductor. The active inductor comprises a variable resistive circuit having an effective resistance, wherein the variable resistive circuit is comprised of at least one resistor that can be selectively bypassed in the variable resistive circuit to vary the effective resistive. The active inductor has an inductance that can be varied by varying the effective resistance.

11 Claims, 9 Drawing Sheets

75

200

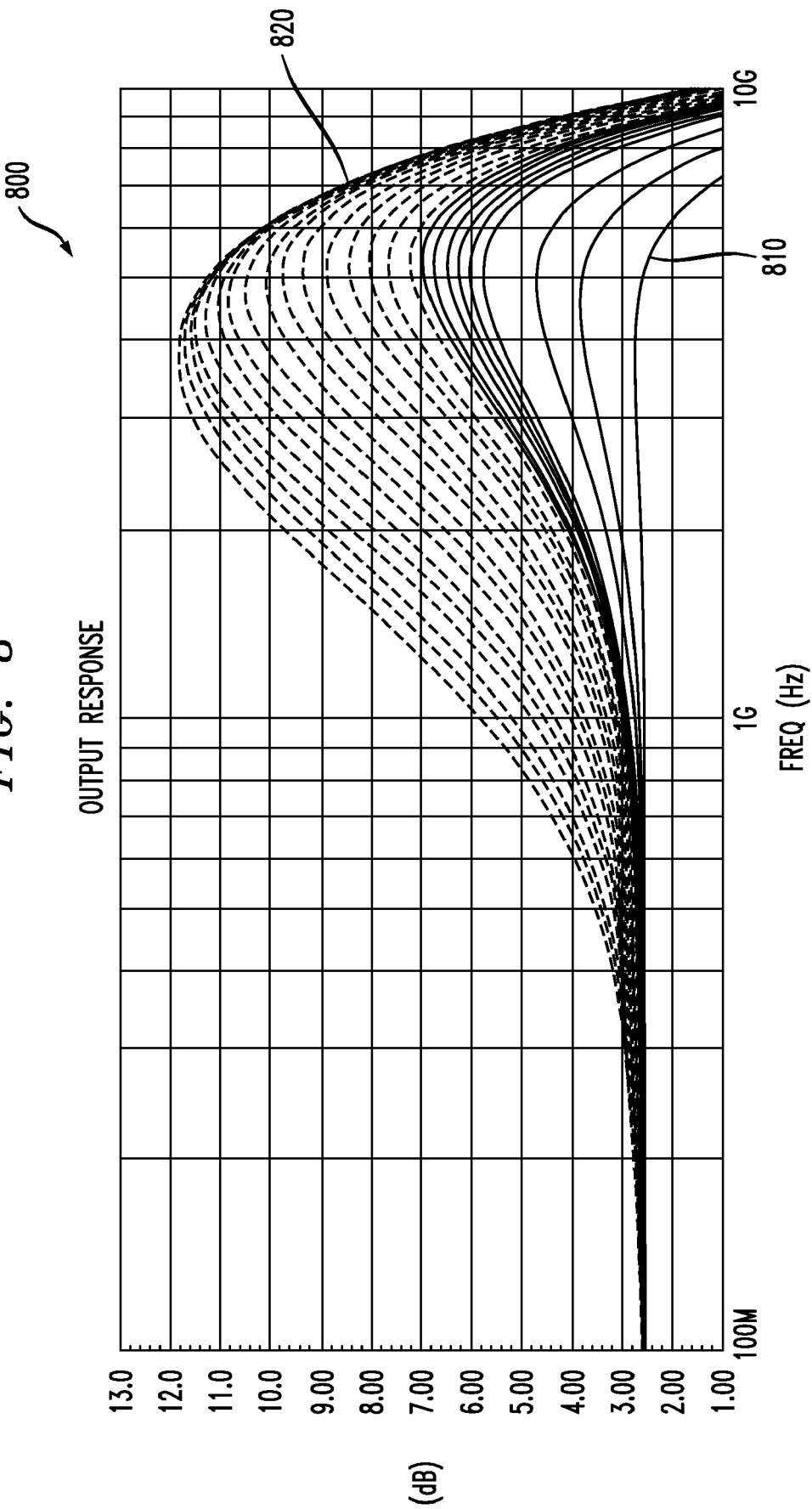

1100

1400

US 7,656,255 B2

METHODS AND APPARATUS FOR PROGRAMMABLE ACTIVE INDUCTANCE

FIELD OF THE INVENTION

The present invention relates generally to active inductor circuits, and more particularly, to improved active inductor circuits employing a variable resistance.

BACKGROUND OF THE INVENTION

Active inductors are often used to extend the bandwidth of bandwidth-limited circuits, such as amplifiers employed in high frequency communication systems. The bandwidth of an active inductor-loaded amplifier (or buffer) is generally a function of the total output capacitance and resistance, along with an inductance "L" which, for an active inductor, is in turn a function of a resistance "R", parasitic capacitance, and transconductance of the transistor utilized to implement the active inductor.

A number of techniques have been proposed or suggested for tuning an active inductor utilizing a fixed resistance value such that a portion of the capacitive load is canceled (and the bandwidth is thereby extended). Process variations in the manufacturing of integrated circuits, temperature variations, and supply variations, however, often significantly affect the resulting resistance, capacitance, and transconductance of an active inductor circuit. Thus, the resulting available bandwidth is also subject to wide variations, despite any selection of resistance or capacitance values for fabrication.

U.S. patent application Ser. No. 10/929,843, entitled. "Three-Terminal, Tunable Active Inductor," assigned to the assignee of the present invention and incorporated by reference herein, discloses an active inductor circuit that is capable of being tuned to achieve a desired bandwidth, over process, temperature and supply variations. Generally, one embodiment of the disclosed active inductor circuit controls the gate voltages applied to one or more PMOS transistors to provide a variable resistance and thereby extend the bandwidth. While the disclosed active inductor circuit can be continuously tuned to achieve a desired bandwidth, it has been found that the range of resistance control required for some applications requires prohibitively large PMOS devices.

A need therefore exists for an improved active inductor device that provides a tunable bandwidth using digital control. A further need exists for an active inductor device that provides a tunable bandwidth with improved linearity.

SUMMARY OF THE INVENTION

Generally, methods and apparatus are provided for programmable active inductance. The disclosed active inductor devices provide a tunable bandwidth with improved linearity. According to one aspect of the invention, an active inductor is disclosed having a variable frequency response corresponding to a variable inductance of the active inductor. The active inductor comprises a variable resistive circuit having an effective resistance, wherein the variable resistive circuit is comprised of at least one resistor that can be selectively bypassed in the variable resistive circuit to vary the effective resistive. The active inductor has an inductance that can be varied by varying the effective resistance.

In one exemplary embodiment, the variable resistive circuit comprises at least one resistor connected in parallel with a corresponding switch, wherein the corresponding switch is controlled by a control signal to selectively bypass the corresponding resistor such that the corresponding resistor does not contribute to the effective resistance. In another exemplary embodiment, the variable resistive circuit comprises at least one resistor connected in series between an upper terminal, U, and a lower terminal, L, wherein each of the at least one resistors has an associated switch, wherein the associated switch is controlled by a control signal to selectively include one or more of the at least one resistors between the associated switch and one of the upper and lower terminals.

A more complete understanding of the present invention, as well as further features and advantages of the present invention, will be obtained by reference to the following detailed description and drawings.

BRIEF DESCRIPTION OF THE DRAWINGS

FIG. 8 illustrates the output response of an exemplary cascaded amplifier of FIG. 5;

DETAILED DESCRIPTION

Figure 1:
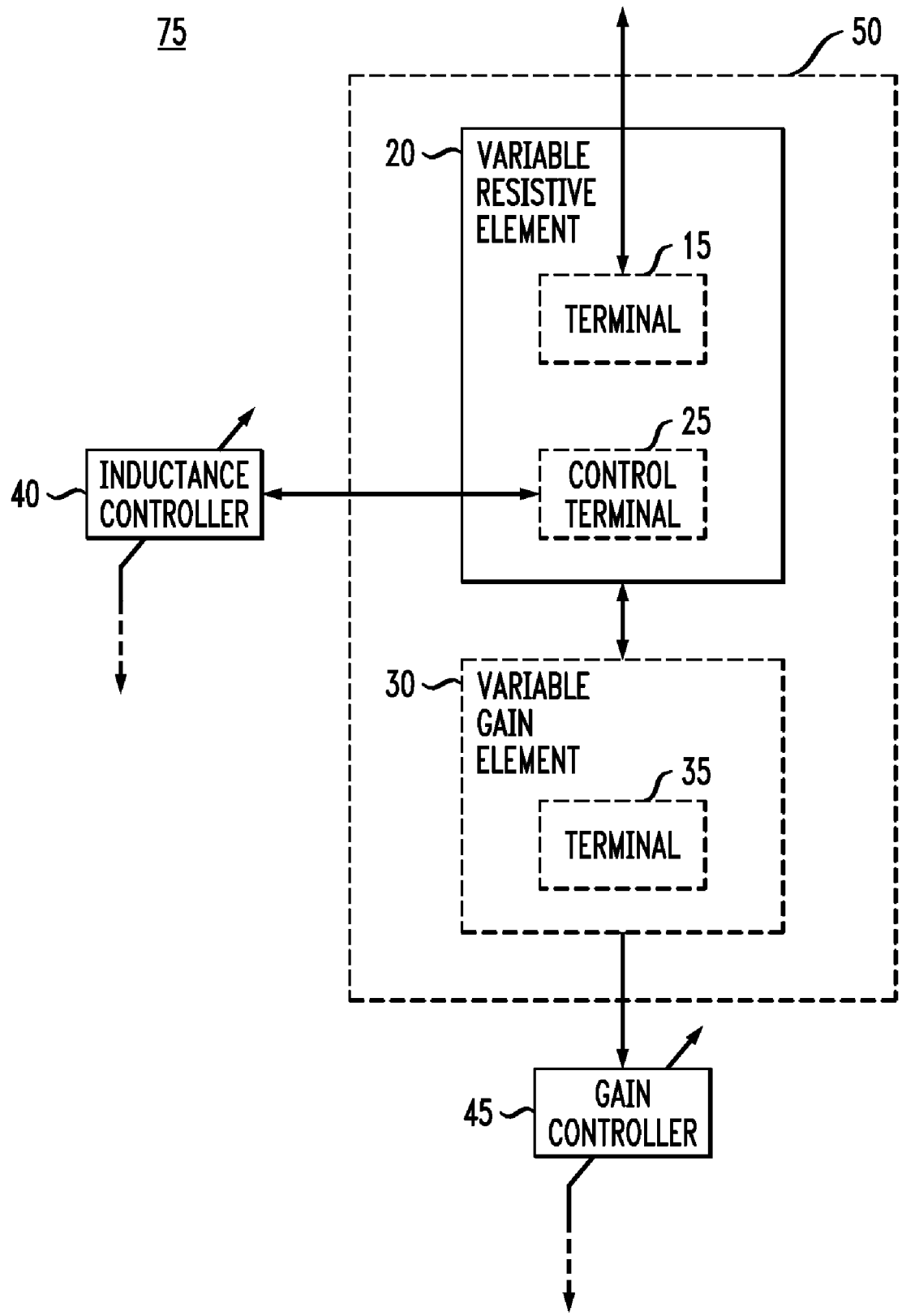
FIG. 1 is a block diagram illustrating a conventional apparatus employing an active inductor.

FIG. 1 is a block diagram illustrating a conventional apparatus 50 and system 75 in accordance with the teachings of U.S. patent application Ser. No. 10/929,843, entitled "Three-Terminal, Tunable Active Inductor," incorporated by reference herein. As shown in FIG. 1, the first apparatus 50 comprises a variable resistive element 20 and a variable gain element 30. The first system 75 comprises the variable resistive element 20 and the variable gain element 30, in conjunction with an inductance controller 40 and a gain controller 45.

The variable resistive element 20 has a control terminal 25, as a first terminal of the apparatus 50, that provides for coupling to the inductance controller 40. The inductance controller 40 controls the resistance of the variable resistive element 20, and may receive and be responsive to feedback from other portions of any circuit coupled to the system 75. As shown in FIG. 1, the variable resistive element 20 also includes a terminal 15, as a second terminal of the apparatus 50, for coupling to other portions of any circuit which includes the system 75.

The variable gain element 30 also includes a terminal 35, as a third terminal of the apparatus 50 that provides for coupling to the gain controller 45 and also for coupling to other portions of any circuit which includes the system 75. The gain controller 45 controls the gain of the variable gain element 30, and may receive and be responsive to feedback from other portions of any circuit coupled to the system 75.

In the apparatus 50, inductance "L" has a lineal relationship to the resistance (or, equivalently, impedance) R of the variable resistive element 20 and any parasitic capacitance "C", and an inverse (linear) relationship to a transconductance "$g_m$" of the variable gain element 30. This relationship may be expressed, for example, as $L=mR(C/g_m)$, where "m" may be a constant. The inductance of the apparatus 50 is controlled by varying the resistance (R) and transconductance ($g_m$), through the inductance controller 40 and gain controller 45, respectively, to achieve a selected or desired inductance and corresponding frequency response or bandwidth. This control may be implemented using any suitable feedback arrangement from any other coupled circuitry to the inductance controller 40 and/or the gain controller 45.

Figure 2:
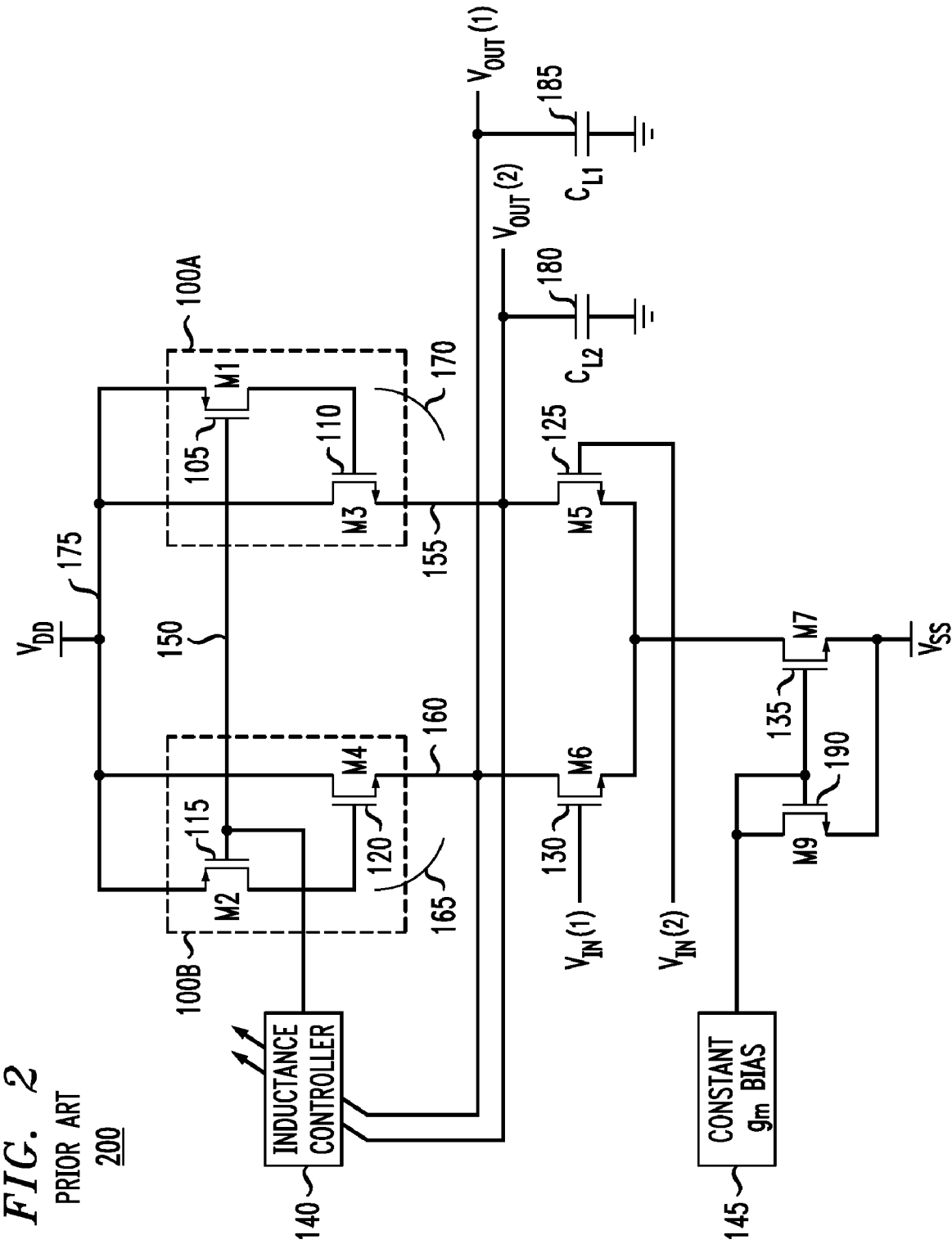
FIG. 2 is a circuit illustrating an exemplary embodiment of the apparatus of FIG. 1.

FIG. 2 is a block diagram illustrating a second exemplary apparatus embodiment 100 and a second exemplary system embodiment 200. In FIG. 2, two structurally identical apparatuses 100A and 100B are illustrated, each being utilized with a corresponding portion of a differential amplifier stage (transistors M5 (125) and M6 (130)) comprising the system 200, and are individually and collectively referred to as an apparatus 100. Each apparatus 100 comprises a p-channel FET (pFET), as a controllable and variable resistive element (such as a variable resistive element 20), coupled to an n-channel FET (nFET), as a controllable and variable gain element (such as variable gain element 30).

More specifically, for apparatus 100A, a pFET M1 (105) has a source coupled to a voltage supply (or voltage supply bus) Vdd, a drain coupled to a gate of an nFET M3 (110), and a gate coupled (through node 150) to an inductance controller 140 (and the gate of M2 (115)). An inductance control voltage is provided on node 150. The nFET M3 (110) has a drain coupled to a voltage supply (or voltage supply bus) Vdd, a gate coupled to the drain of the pFET M1 (105), and a source coupled (through node 155) to the remainder of the system 200 which, in this case, is the drain of the differential amplifier transistor M5 (125) (which also provides one of the differential output voltages, Vout(2)). In addition, it should be noted that NFET M3 has a gate-to-source (170) parasitic capacitance (referred to herein as "$Cgs_{(a)}$"), and a transconductance $g_{m(a)}$. Although not separately illustrated in FIG. 2, each of the various transistors has a corresponding substrate connection, such as to Vdd or to Vss (typically ground).

As illustrated, apparatus 100B is structurally identical to apparatus 100A, providing a corresponding active inductor for the transistor M6 (130) of the differential amplifier. More specifically, for apparatus 100B, a pFET M2 (115) has a source coupled to the voltage supply (or voltage supply bus) Vdd, a drain coupled to a gate of an nFET M4 (120), and a gate coupled (through node 150) to the inductance controller 140 (and the gate of M1 (105)). The nFET M4 (120) has a drain coupled to a voltage supply (or voltage supply bus) Vdd, a gate coupled to the drain of the pFET M2 (115), and a source coupled (through node 155) to the remainder of the system 200 which, in this case, is the drain of the differential amplifier transistor M6 (130) (which also provides the second of the differential output voltages, Vout(1)). In addition, it should be noted that nFET M4 has a gate-to-source (165) parasitic capacitance (referred to herein as "$Cgs_{(b)}$"), and a transconductance $g_{m(b)}$.

In the illustrated embodiment, each pFET (105 or 115) provides a control terminal, node 150, as one of the three terminals of the inductor (with the other two terminals being node 175 and either node 155 or 160 (for respective apparatuses 100A and 100B)). Through such a control terminal, the resistance of the pFET may be adjusted to correspondingly vary the inductance of the apparatus 100. More specifically, and as mentioned above for the first apparatus 50, for each second apparatus 100A or 100B, the inductance "L" of the apparatus 100 has a linear relationship to the resistance (or, equivalently, impedance) R of the pFET (M1 (105) or M2 (115)), the parasitic gate-to-source capacitance Cgs of the corresponding nFET (M3 (110) or M4 (120)), and an inverse (linear) relationship to the transconductance $g_m$ of the corresponding nFET (M3 (110) or M4 (120)). This relationship may be expressed, for example, as $L=kR(Cgs/g_m)$, where "k" may be a constant. The resistance (or impedance) R of the pFET (M1 (105) or M2 (115)) may be varied as a function of the corresponding gate-to-source voltage (Vgs) of the pFET, and controlled through the third (control) terminal (at node 150) using the inductance controller 140, with resistance decreasing with greater Vgs (i.e., gate voltage being lower for a positive Vdd).

The inductance controller 140, as indicated above, provides control over the impedance or resistance of pFETs (M1 (105) or M2 (115)) by controlling their corresponding gate voltages (biases) at node 150, to provide the desired or selected frequency response. As illustrated in the second system 200, the inductance controller 140 may receive feedback from the corresponding output voltages at output terminals Vout(1) (across capacitor 180) and Vout(2) (across capacitor 185, where capacitors 180 and 185 represent loads of other coupled circuitry), or from elsewhere in any other coupled circuitry, utilizing any known feedback or control methodology.

The bandwidth (or frequency response) of the system 200 is also a function of the transconductance ($g_m$) (or gain) of the corresponding nFETs (M3 and M4) and the total capacitance (as seen from the output terminals Vout(1) and Vout(2)). These may also be varied (or kept constant) to provide a selected or desired frequency response (generally in conjunction with the operation of the inductance controller 40 or 140). As illustrated in FIG. 2, as an exemplary gain controller 45, $g_m$ bias generator 145 is utilized with a diode-connected nFET M9 (190) to provide a bias voltage to a gate of nFET M7 (135), thereby controlling the level of drain-to-source current through M7 and providing for a desired or selected $g_m$ of the series-coupled nFETs (M3, MS5 and M4, M6), such as a constant $g_m$. A gain controller 45 or $g_m$ bias generator 145, utilized for providing a constant $g_m$ or variable $g_m$, may be implemented as known in the art.

While illustrated using two three-terminal, tunable inductors (100A and 100B) with a differential amplifier, a system may implement any desired or selected functionality. In addition, such a system may utilize any desired or selected number of three-terminal, tunable inductors 100. For example, in many instances, only one three-terminal tunable inductors 100 may be needed. The illustrated differential amplifier of system 200 may also be coupled to other differential amplifier stages, each of which having additional pairs of three-terminal, tunable inductors 100.

As previously indicated, it has been found that the range of resistance control required for some applications using the embodiments of FIG. 1 or 2 requires prohibitively large PMOS devices.

Figure 3:
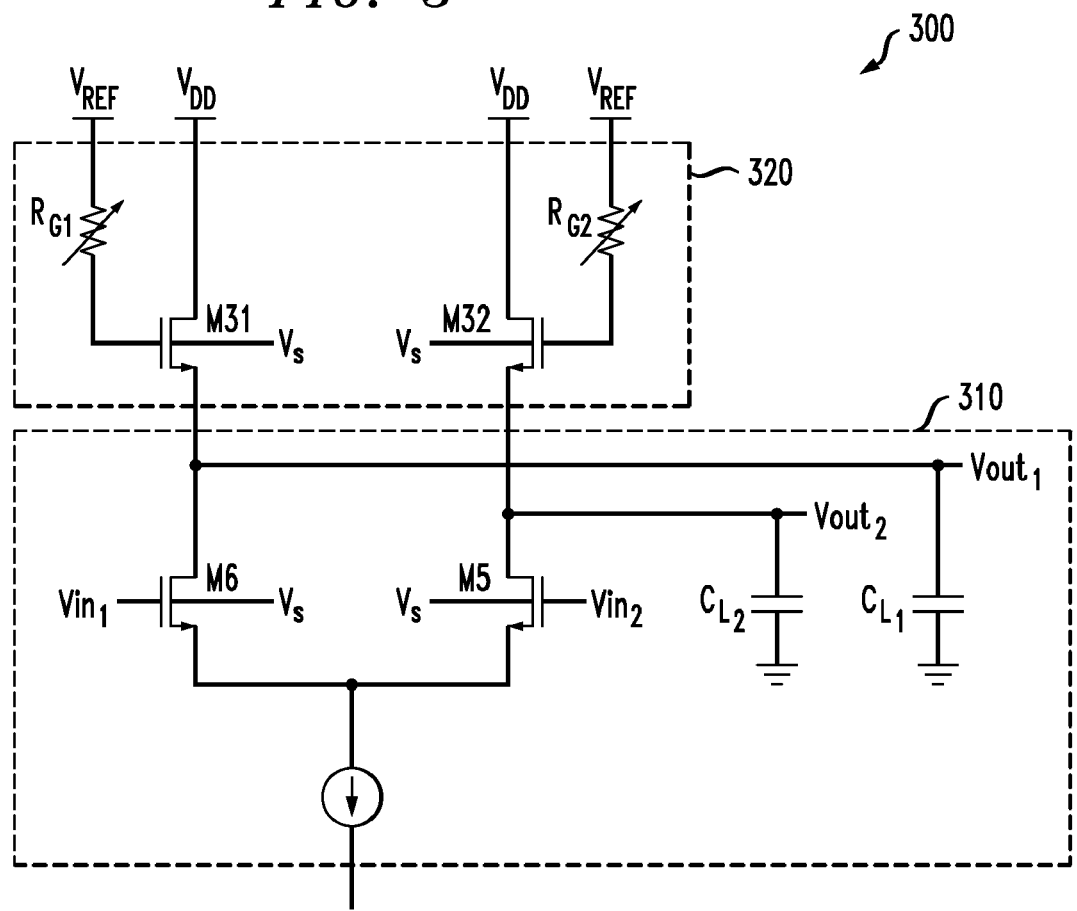
FIG. 3 illustrates an amplifier incorporating an active inductor in accordance with the present invention.

FIG. 3 illustrates an amplifier (i.e., a differential gain circuit) 300 incorporating an active inductor 320 in accordance with the present invention. As shown in FIG. 3, the amplifier 300 includes a differential pair 310, in a similar manner to the conventional implementation shown in FIG. 2, and the active inductor 320. The differential pair includes transistors M5 and M6, in a well known manner.

The exemplary active inductor 320 includes NMOS transistors M31 and M32, as well as variable resistors $R_{G1}$ and $R_{G2}$. According to one aspect of the present invention, the resistance of the variable resistors $R_{G1}$ and $R_{G2}$ is programmable, under digital control. Exemplary embodiments of the tunable resistors $R_{G1}$ and $R_{G2}$ are discussed further below in conjunction with FIGS. 6 and 7. Generally, as the resistance values of $R_{G1}$ and $R_{G2}$ are increased, the equivalent inductance of the active inductor 320 is also increased to thereby increase the gain/peaking of the amplifier 300 at higher frequencies.

It is noted that the control voltage, $V_{REF}$, that is applied to the tunable resistors $R_{G1}$ and $R_{G2}$ could optionally be equal to $V_{DD}$ or independent of $V_{DD}$.

Figure 4:
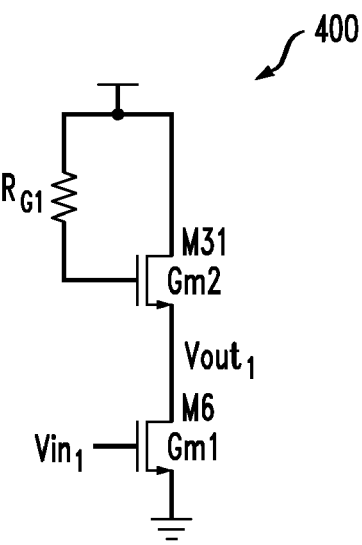
FIG. 4 illustrates a half circuit representation of the amplifier of FIG. 3.

FIG. 4 illustrates a half circuit representation 400 of the amplifier 300 of FIG. 3. As shown in FIG. 4 and discussed further below, the resistance, $R_{G1}$, of the gate node's path to AC ground is varied proportionally to a digital control word. In this manner, the location of the zero of the frequency response is shifted under digital control, as discussed further below in conjunction with FIG. 8. Thus, an adaptive equalization method is provided. The control bits may be encoded in various ways apparent to those of ordinary skill in the art to implement a linear or nonlinear shift in transfer function critical frequencies. Exemplary embodiments for digital control of the variable resistors $R_{G1}$ and $R_{G2}$ are discussed further below in conjunction with FIGS. 6 and 7.

The present invention can be employed, for example, when additional gain/peaking is needed at higher frequencies. According to a further embodiment of the present invention, the disclosed active inductors 320 are employed in an adjustable equalizer.

The transfer function for the half circuit representation 400 of FIG. 4 is discussed further below in conjunction with FIG. 10, to further characterize the frequency response achieved with the active inductors 320 of the present invention.

Figure 5:
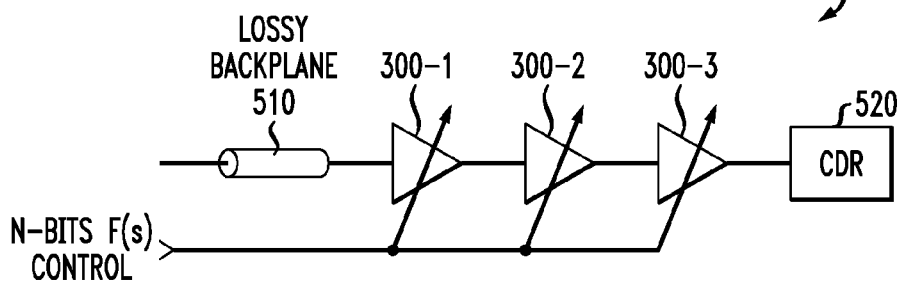
FIG. 5 illustrates an exemplary amplifier comprised of a number of cascaded differential gain circuits of FIG. 3.

FIG. 5 illustrates an exemplary amplifier 500 comprised of a number of cascaded differential gain circuits 300-1 through 300-N of FIG. 3. In this manner, an overall gain function is achieved with a programmable equalization transfer function. As shown in FIG. 5, a signal is received, for example, from a lossy backplane 510 and applied to the cascaded differential gain circuits 300-1 through 300-3. The output of the equalizing amplifier at the final differential gain circuit 300-3 can then be used to drive, for example, a clock and data recovery (CDR) block 520 in a serializer/deserializer (SERDES). The transfer function tuning control bits can be derived from an eye-monitoring or least mean square (LMS) adaptive equalization decision block.

The output response of the exemplary amplifier 500 is discussed further below in conjunction with FIG. 8. For example, if each amplifier 300 provides a boost of 3 dB, and there are three cascaded amplifiers 300, then the cumulative boost will be 9 dB. In addition, the resistance of each tunable resistors $R_G$ in each amplifier 300 can be varied independently to provide intermediate values.

Figure 6:
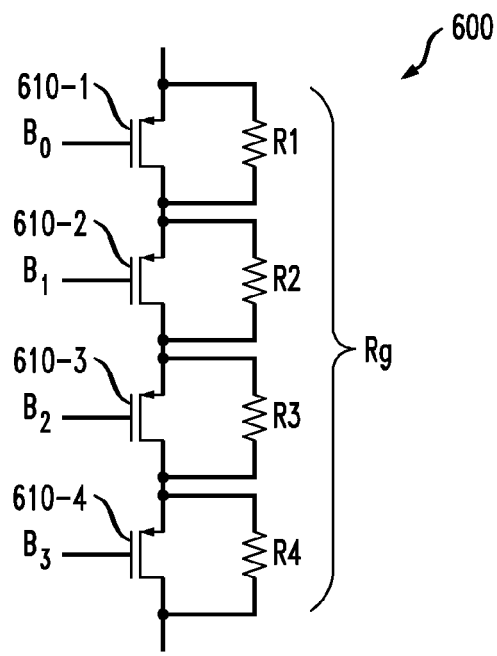
FIG. 6 illustrates an exemplary implementation of a tunable resistance, $R_G$.

FIG. 6 illustrates an exemplary implementation of a tunable resistance, $R_G$, 600 of FIG. 3. As shown in FIG. 6, the tunable resistance, $R_G$, 600 is comprised of a number of resistors, such as R1 through R4 in the exemplary embodiment. Each resistor R1 through R4 is connected in parallel with a corresponding PMOS transistor 610-1 through 610-4. It is noted that other well-known forms of switches may be used as an alternative to the PMOS transistors 610.

Each transistor 610 is under control of a corresponding control word B0 through B3 that selectively enables the corresponding transistor. When the control voltage is applied to the gate of the transistor (transistor enabled), the transistor operates as a short circuit to bypass the corresponding resistor so the resistor does not contribute to the overall resistance of the tunable resistance, $R_G$, 600. When the control voltage is not applied to the gate of the transistor (transistor disabled), the transistor operates as an open circuit to include the corresponding resistor in the path. Thus, generally, if all transistors are operating as an open circuit, the total resistance is the sum of R1 through R4. In addition, as each transistor is shorted, the total resistance value is reduced.

Figure 7:
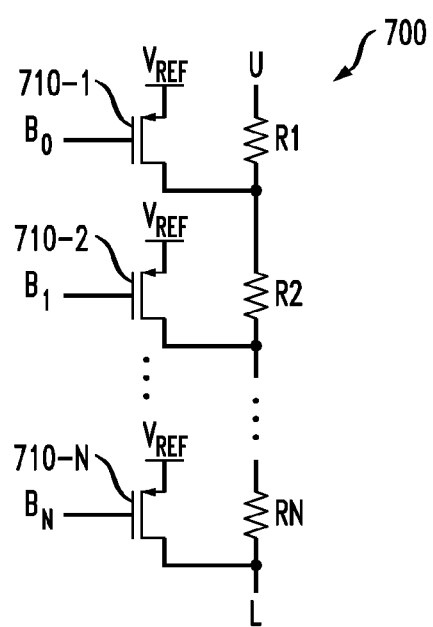
FIG. 7 illustrates an alternate implementation of a tunable resistance, $R_G$.

FIG. 7 illustrates an alternate implementation of a tunable resistance, $R_G$, 700 of FIG. 3. As shown in FIG. 7, the tunable resistance, $R_G$, 700 is comprised of a number of resistors R1 through RN connected in series between an upper terminal or node, U, and a lower terminal or node, L. Each resistor R1 through RN has an associated PMOS transistor 710-1 through 710-N. It is noted that the transistors 710-1 through 710-N operate as switches to selectively include one or more resistors. It is further noted that other well-known forms of switches may be used as an alternative to the PMOS transistors 710.

When the appropriate control voltage is applied to the gate of one or more transistors 710-1 through 710-N, the enabled transistor(s) will operate as switches in the closed position (short circuit) and all the resistors included between the enabled transistor and the lower terminal, L, are active in the circuit. Each transistor 710 is under control of a corresponding control word B0 through B3 that selectively enables the corresponding transistor. When the control voltage is applied to the gate of a given transistor (transistor enabled), the transistor is shorted out and all of the resistors between the enabled transistor and the lower terminal, L are included in the circuit. Thus, generally, if transistor 710-1 is enabled and operating as a short circuit, the total resistance is the sum of R1 through RN (maximum resistance). In addition, if only transistor 710-N is enabled and operating as a short circuit, all of the resistors R1 through RN are bypassed to provide the minimum resistance.

FIG. 8 illustrates the output response 800 (gain magnitude in dB as a function of frequency) of the cascaded amplifier 500 of FIG. 5. The digital word controlling the zero location was varied with each successive simulation. As shown in FIG. 8, the gain/peaking is increased as the resistance is increased. For example, a first curve 810 is associated with a minimum resistance, while curve 820 is associated with a maximum resistance.

Figure 9A:
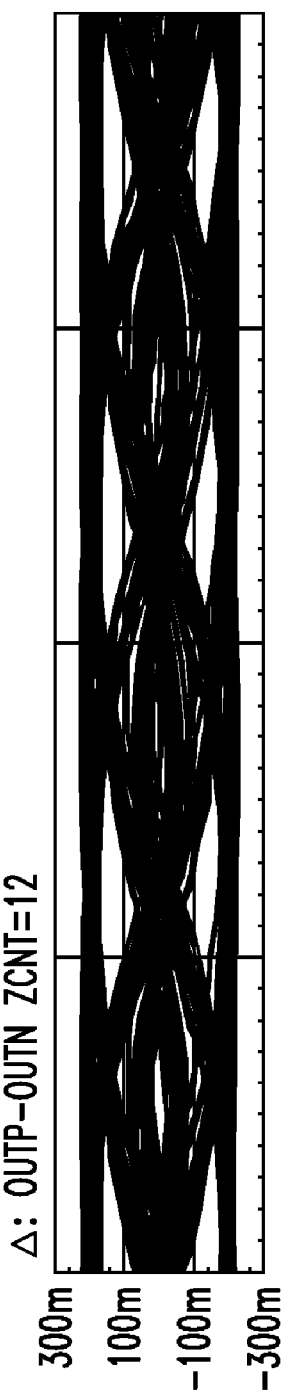
FIGS. 9A through 9C illustrate the effect that adjusting the simulated circuit's zero location has on opening the binary eye of a pseudo-random non-return-zero signal that has been band limited by passing the signal through a lossy backplane transmission line model.
Figure 9B:
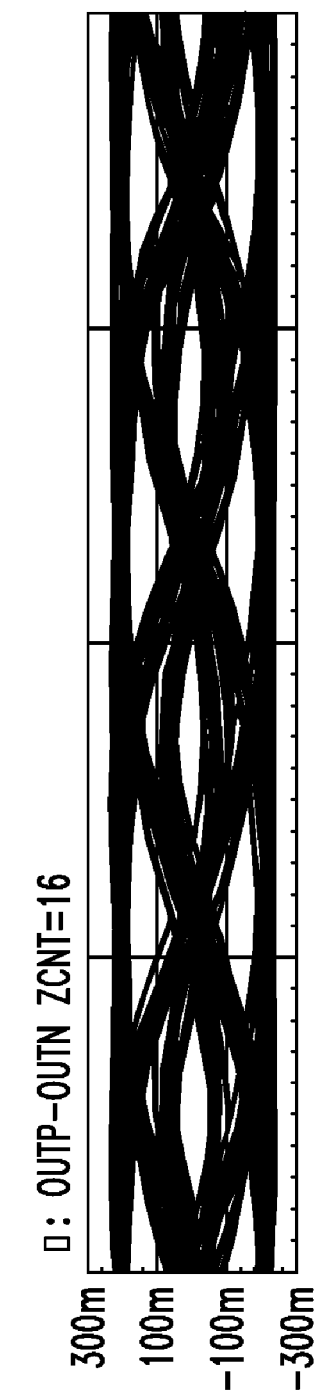
Figure 9C:
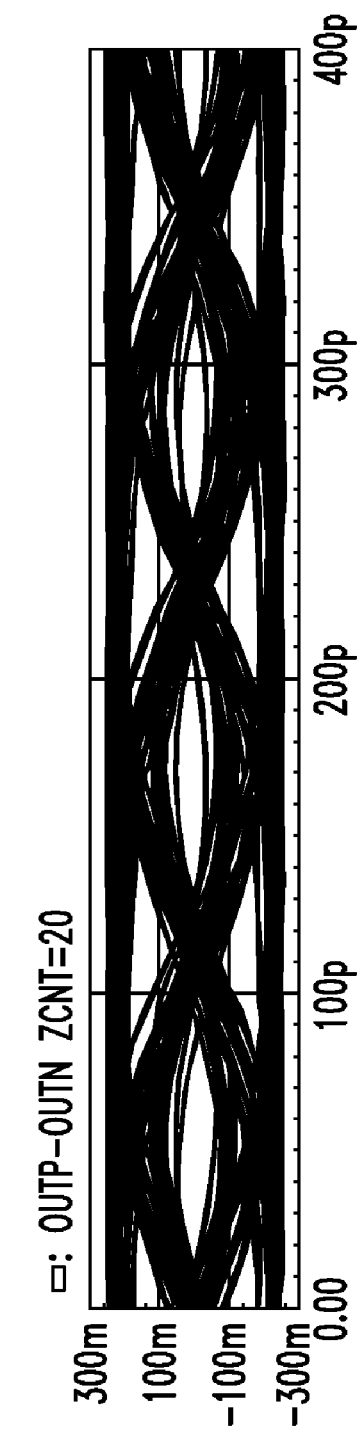

FIGS. 9A through 9C illustrate the effect that adjusting the simulated circuit's zero location has on opening the binary eye of a pseudo-random non-return-zero signal that has been band limited by passing the signal through a lossy backplane transmission line model. As the control word (ZCNT) was advanced to change the resistance from FIGS. 9A through 9C, the frequency response of the equalizer was adjusted and the large signal group delay was improved thus improving the data reception eye.

Figure 10:
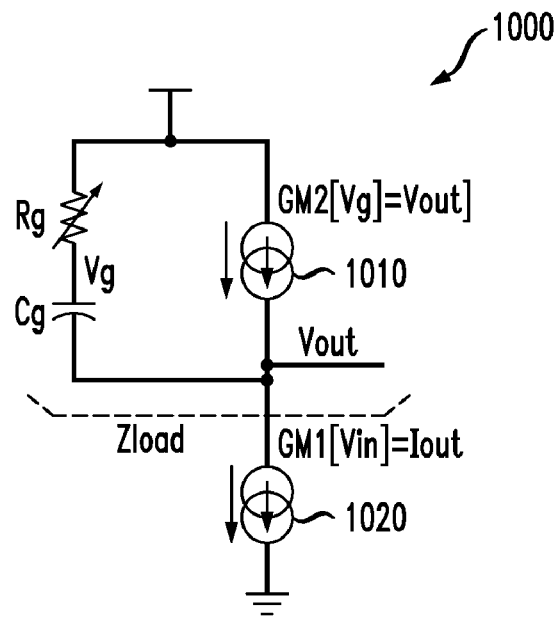
FIG. 10 illustrates the small signal equivalent circuit for the half circuit representation of FIG. 4.

FIG. 10 illustrates the small signal equivalent circuit 1000 for the half circuit representation 400 of FIG. 4. As shown in FIG. 10, the transistors M31 and M6 are represented as voltage controlled current sources 1010, 1020, respectively. The current generated by the current sources 1010, 1020 is a function of voltage applied to the gate of the corresponding transistor M31, M6 multiplied by the transconductance of the corresponding transistor The impedance, $Z_{load}$, of the load seen by the amplifier M6 can be expressed as follows:

$$Z_{load} = \frac{V_{out}}{I_{out}} = \frac{1+sRgCg}{sCg+GM2} = \frac{1}{GM2}\left(\frac{1+sRgCg}{1+\frac{sCg}{GM2}}\right) = \frac{1}{GM2}\left(\frac{1+\frac{s}{Z_1}}{1+\frac{s}{P_1}}\right)$$

Figure 11:
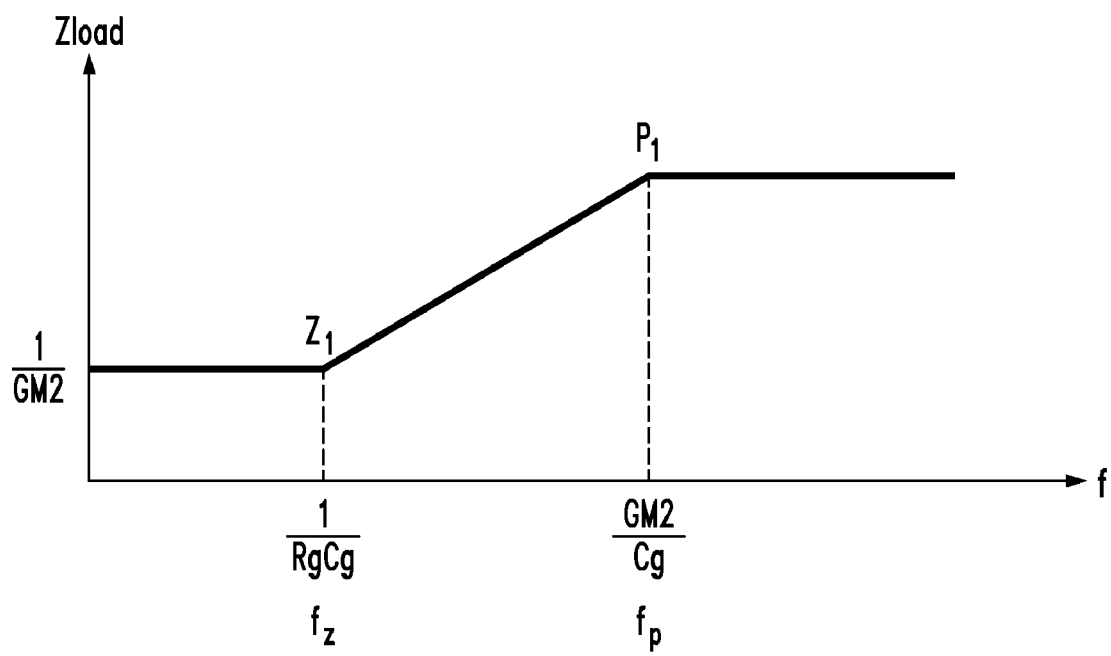
FIG. 11 illustrates the transfer fraction of the small signal equivalent circuit of FIG. 10.

As previously indicated, the active inductors 320 of the present invention provide adjustable high frequency gain/peaking. FIG. 11 illustrates the transfer function 1100 of the small signal equivalent circuit 1000 of FIG. 10. As shown in FIG. 11, the shift in zero frequency, $f_z$, can be expressed as 1/RgCg. Thus, the zero frequency is a function of the tunable resistance, Rg.

Figure 12:
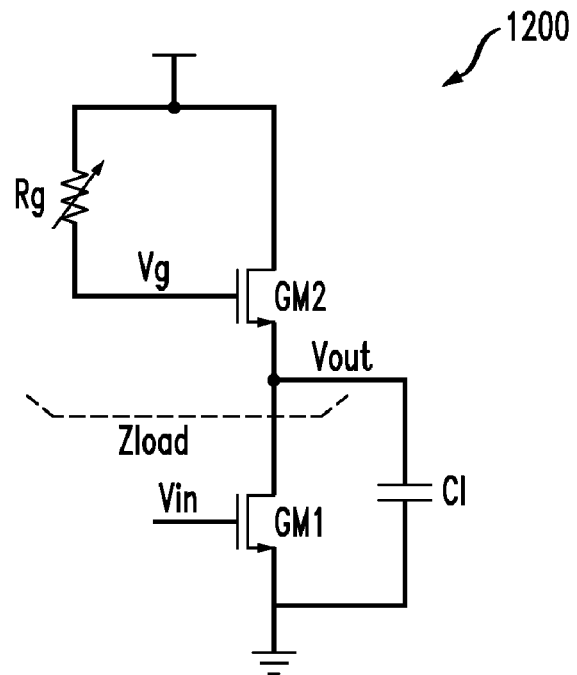
FIG. 12 illustrates an alternate half circuit representation of the amplifier of FIG. 3, where the capacitance of the load, $C_l$, is considered.
Figure 13:
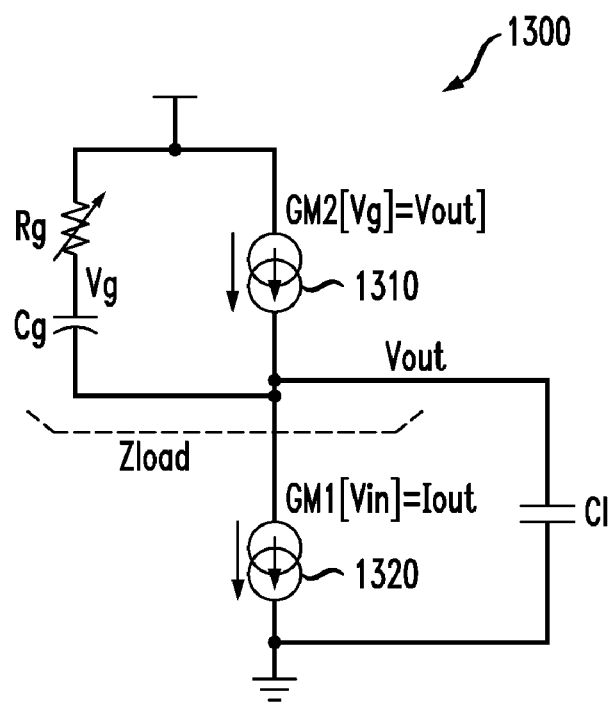
FIG. 13 illustrates the small signal equivalent circuit for the half circuit representation of FIG. 12.

FIG. 12 illustrates an alternate half circuit representation 1200 of the amplifier 300 of FIG. 3, where the capacitance of the load, $C_l$, is considered. FIG. 13 illustrates the small signal equivalent circuit 1300 for the half circuit representation 1200 of FIG. 12.

As shown in FIG. 13, the transistors M31 and M6 are represented as voltage controlled current sources 1310, 1320, respectively. The current generated by the current sources 1310, 1320 is a function of voltage applied to the gate of the corresponding transistor M31, M6 multiplied by the transconductance of the corresponding transistor.

Using the small signal equivalent circuit 1300, the impedance, $Z_{load}$, of the load seen by the amplifier M6 can be expressed as a function of the load capacitance, $C_l$, as follows:

$$Z_{load} = \frac{V_{out}}{I_{out}} = \frac{1+sRgCg}{GM2+s(Cg+Cl)+s^2ClCgRg} \approx \frac{1}{GM2}\left(\frac{1+\frac{s}{Z_1}}{\left(1+\frac{s}{P_1}\right)\left(1+\frac{s}{P_2}\right)}\right)$$

Figure 14:
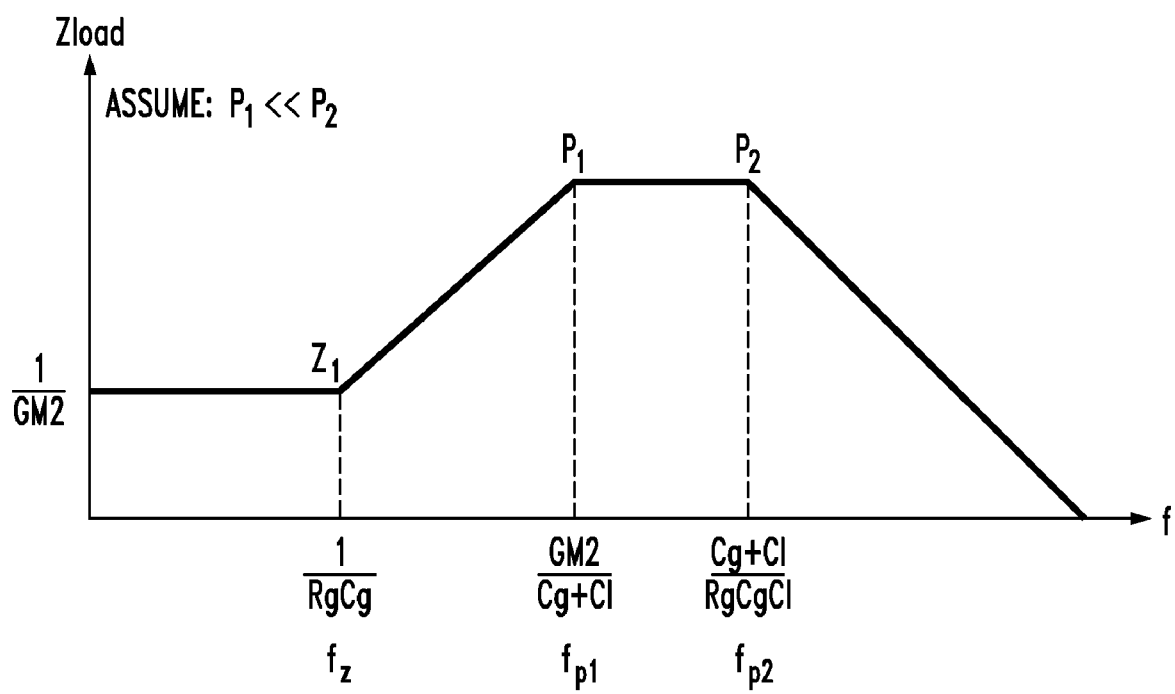
FIG. 14 illustrates the transfer function of the small signal equivalent circuit of FIG. 12.

FIG. 14 illustrates the transfer function 1400 of the small signal equivalent circuit 1200 of FIG. 12. As shown in FIG. 14, the shift in zero frequency $f_z$, can again be expressed as 1/RgCg. Thus, the zero frequency is a function of the tunable resistance, Rg. In addition, the two pole frequencies can be expressed as $GM2/C_g+C_l$ and $C_g+C_l/R_gC_gC_l$. $P_2$ is also a function of Rg, therefore, as shown in FIG. 8, the frequency of the peaking is reduced as Rg nears its maximum setting.

A plurality of identical die are typically formed in a repeated pattern on a surface of the wafer Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

It is to be understood that the embodiments and variations shown and described herein are merely illustrative of the principles of this invention and that various modifications may be implemented by those skilled in the art without departing from the scope and spirit of the invention.

We claim:

1. An amplifier, comprising:
   an active inductor comprising a variable resistance circuit having an effective resistance, wherein said variable resistance circuit is comprised of at least one resistor that can be selectively bypassed in said variable resistance circuit to vary said effective resistance; and
   a variable gain element having a gain that varies as a function of frequency, wherein a location of a zero of a frequency response is shifted by setting said variable resistance based on a digital control to provide adaptive equalization.

2. The amplifier of claim 1, wherein said variable resistance circuit comprises said at least one resistor connected in parallel with a corresponding switch, wherein said corresponding switch is controlled by a control signal to selectively bypass said corresponding resistor such that said corresponding resistor does not contribute to said effective resistance.

3. The amplifier of claim 1, wherein said variable resistance circuit comprises said at least one resistor connected in series between an upper terminal (U) and a lower terminal (L) wherein each of said at least one resistors has an associated switch, wherein said associated switch is controlled by a control signal to selectively include one or more of said at least one resistors between said associated switch and one of said upper and lower terminals.

4. The amplifier of claim 1, wherein said variable gain element is a differential pair of transistors.

5. The amplifier of claim 1, wherein said active inductor is embodied as an integrated circuit.

6. A method for controlling an adaptive equalization of an amplifier, said amplifier comprising an active inductor and a variable gain element, said method comprising:
   adjusting an effective resistance of said active inductor, said active inductor comprising a variable resistance circuit comprised of at least one resistor that can be selectively bypassed in said variable resistance circuit to vary said effective resistance and shift a location of a zero of a frequency response of said variable gain element based on a digital control to provide said adaptive equalization.

7. The method of claim 6, wherein said variable resistance circuit comprises said at least one resistor connected in parallel with a corresponding switch, wherein said method further comprises the step of controlling said corresponding switch using a control signal to selectively bypass said corresponding resistor such that said corresponding resistor does not contribute to said effective resistance.

8. The method of claim 6, wherein said variable resistance circuit comprises said at least one resistor connected in series between an upper terminal (U) and a lower terminal (L) wherein each of said at least one resistors has an associated switch, wherein said method further comprises the step of controlling said associated switch using a control signal to selectively include one or more of said at least one resistors between said associated switch and one of said upper and lower terminals.

9. The method of claim 6, wherein each possible value of said effective resistance of said variable resistive circuit has a corresponding transfer function.

10. The method of claim 9, wherein each of said corresponding transfer functions has a zero frequency that is a function of said effective resistance.

11. The method of claim 6, further comprising the step of varying an inductance of said active inductor by varying said effective resistance.

* * * * *